US007461092B1

(12) United States Patent
Sigel et al.

(10) Patent No.: US 7,461,092 B1
(45) Date of Patent: *Dec. 2, 2008

(54) CONTENT ORGANIZATION AND STORAGE METHOD FOR STORING HOLOGRAPHIC SEARCH DATABASE

(75) Inventors: Christophe Sigel, Broomfield, CO (US); Michael L. Leonhardt, Longmont, CO (US); William Lynch, Boulder, CO (US); Paulo E. X. Silveira, Boulder, CO (US)

(73) Assignee: Storage Technology Corporation, Louisville, CO (US)

( * ) Notice: Subject to any disclaimer, the term of this patent is extended or adjusted under 35 U.S.C. 154(b) by 436 days.

This patent is subject to a terminal disclaimer.

(21) Appl. No.: 11/224,454

(22) Filed: Sep. 12, 2005

(51) Int. Cl.
*G06F 17/30* (2006.01)
(52) U.S. Cl. .......................... 707/104.1; 707/1; 707/3; 707/100; 707/101
(58) Field of Classification Search .................. 707/1, 707/2, 3, 100, 101, 102, 103, 104.1; 359/1
See application file for complete search history.

(56) References Cited

U.S. PATENT DOCUMENTS

| 5,627,664 | A * | 5/1997 | Trisnadi ....................... 359/11 |
| 6,175,543 | B1 | 1/2001 | Burr et al. .................... 369/103 |
| 6,205,107 | B1 | 3/2001 | Burr ............................. 369/103 |
| 2003/0039001 | A1 * | 2/2003 | King et al. ..................... 359/35 |
| 2003/0072045 | A1 * | 4/2003 | King et al. ..................... 359/11 |
| 2003/0076765 | A1 * | 4/2003 | Ayres et al. .................. 369/103 |
| 2004/0194151 | A1 * | 9/2004 | Earhart ......................... 725/135 |

OTHER PUBLICATIONS

Burr et al., "Content-addressable data storage by use of volume holograms", Applied Optics, vol. 28, No. 32, Nov. 10, 1999, pp. 6779-6784.
Landauer et al., "An Introduction to Latent Semantic Analysis", Discourse Processes,25, 1998, pp. 259-284.
Lugt, "Signal Detection by Complex Spatial Filtering", IEEE Transactions on Information Theory, vol. 10, Issue 2, 1964, pp. 139-145.
Sigel et al., Data Storage Search System Integrating a Holographic Search Engine.
Sigel et al., Holographic Correlator for Data and Metadata Search.

* cited by examiner

*Primary Examiner*—Cam-Linh Nguyen
(74) *Attorney, Agent, or Firm*—Brooks Kushman P.C.

(57) ABSTRACT

System and method for content-addressable holographic data storage, primarily optimized with respect to search performance. A structured representation of original data, such as represented by metadata, is provided and stored in a holographic data storage medium on which a search can be performed using a holographic correlator. Phase encoding of both data storage and search pages provides improvement of correlator system signal to noise ratio and dynamic range. Heterodyne detection is also used to provide amplification to a plurality of correlation signals by modulation thereof by a plurality of reference beams. In another aspect, increase in the storage density of the holographic data storage medium and the throughput of a holographic correlator is achieved by employing a content-addressable storage scheme, using a priori knowledge of content provided by metadata to organize data according to a selectable content relationship and store related data as a contiguous cluster.

11 Claims, 5 Drawing Sheets

CONTENT ORGANIZATION AND STORAGE METHOD FOR STORING HOLOGRAPHIC SEARCH DATABASE

CROSS-REFERENCE TO RELATED APPLICATIONS

The present application is related to co-pending applications entitled "DATA STORAGE SEARCH SYSTEM INTEGRATING A HOLOGRAPHIC SEARCH ENGINE", Ser. No. 11,224,429, and "HOLOGRAPHIC CORRELATOR FOR DATA AND METADATA SEARCH", Ser. No. 11/224,503, both filed on even data herewith. The above applications are assigned to the same assignee and are incorporated herein by reference.

BACKGROUND OF THE INVENTION

1. Field of the Invention

The present invention relates generally to the fields of optical data storage and database search and, more particularly, to a system and a method for holographic data storage of a content-addressable memory and for content-addressable search of data holographically stored in a holographic data storage medium.

2. Background of the Invention

Storage systems such as automated storage libraries can now contain very large storage databases, ranging in capacity from several terabytes (TB) to 10's of petabytes (PB). Intelligent storage systems also have the ability to retrieve data using content based search, which is currently typically enabled by software-based solutions.

Among the several methods for searching a database, conventional digital electronic search benefits from the non-linearities provided by digital electronics; being thus capable of precisely distinguishing single bit differences within large data sets. Digital electronic search, however, requires sequential retrieval of data records and bit wise comparison to the search query, and is thus limited in speed by the read transfer rate achievable by electronic detection systems. Digital electronic search, accordingly, has severe limitations when applied to large capacity databases containing a very large number of records. For example, at transfer rates of 100 MB/s, typical of current data storage devices, search time for a 1 GB database exceeds ten seconds, and for a 1 TB database up to several hours.

It is known that indexing techniques allow the organization of certain search fields into hierarchical structures (e.g., binary trees) that can be traversed with log(N) complexity, thus greatly reducing the number of operations required per search. Thus, despite being also based on a digital comparison method, database indexing can enable fast searches, but is limited to moderately complex queries. In addition, in a binary tree structure, similar data would likely be stored in non-adjacent and relatively distant locations, thus necessitating multiple searches to identify all instances of content similar data, and therefore partially canceling its benefits. This method is used in most software-based search applications, for both internet and enterprise search.

The limitations of digital search methods can be mostly attributed to the fact that the comparison step occurs after readout and digital conversion, and is therefore inherently speed limited by electronic data read transfer rates. On the other hand, it is well known that optical methods can provide parallel optical processing capabilities, thus enabling parallel computation over large data sets and subsequent readout and digital conversion of the already computed integrated result.

Optical correlation in general and, specifically, holographic correlation provides a hardware based method for searching data more efficiently, where the search and comparison occurs at the physical data layer, and is a part of the holographic reconstruction process. In holographic data storage, holographic recording is accomplished by recording the interference pattern produced by interference of a data bearing object beam and a reference beam within a holographic data storage medium. The data modulated intensity interference pattern is recorded as a spatial modulation of the index of refraction or absorption coefficient of the holographic data storage medium. One implementation of holographic data storage (HDS) provides a data handling advantage by using a spatial light modulator to encode data in the form of bit arrays termed "pages" spatially modulating an object light beam. By changing the properties of the reference beam, and encoding a different data page of the object beam, multiple "page" holograms can be recorded in the same storage volume of the holographic data storage medium, and selectively retrieved by illuminating with the corresponding reference beam. These data pages typically consist of thousands to millions of data bits which are written and/or read in a single step.

A typical high density holographic storage system employs a pair of lenses placed at a distance approximately equal to their focal length on each side of a holographic recording medium. The first lens of the pair of lenses is used to focus the object beam and record the holograms inside the medium at or near the Fourier plane, and the second lens of the pair of lenses collimates the diffracted data beam and produces an image of the data page on a two-dimensional photodetector array. Holographic data storage thus offers large storage densities, random access, and fast transfer rates due to its parallel handling of data, page by page.

Holographic content-addressable or correlational search has been proposed as a parallel optical technique for searching for digital data. In an optical search configuration, the object beam is encoded with a search key page, and is now used to illuminate a storage site, containing a plurality of holographically multiplexed data pages (e.g., using angle multiplexing).

FIG. 1 illustrates a prior art Vander Lugt optical correlator, originally proposed by A. Vander Lugt in "signal detection by complex spatial filtering" IEEE Transactions on Information Theory, 1964, which can also be applied for content-addressable search of a holographic database to assist in explaining the present invention. The optical correlator is generally designated by reference number 100, and employs a similar configuration to that described above for holographic storage, with the difference that the detection system is now placed along the reference beam arm of the system. An object beam 110 is encoded by spatial light modulator (SLM) 101 with a search data page and is incident upon lens 102, which illuminates a single data site in holographic data storage medium 107 with the two-dimensional spatial Fourier transform of the SLM image. Holographic data storage medium 107 comprises a plurality of data sites, each data site storing a plurality of angle multiplexed data holograms, each produced by interfering a given reference beam reflected by scanning mirror 103 with the two-dimensional spatial Fourier transform of a given data page. Each simultaneously illuminated hologram produces a diffracted beam 113 in the direction of its reference recording beam 112, and proportional in amplitude to the product of the search key and stored data page Fourier transforms. The diffracted beams 113 are focused by lens 108 placed along the reference beam arm path, undergoing in the same process an additional two-dimensional spatial Fourier transform, and subsequently illuminate a two-dimensional photodetector array 109 placed in the front focal plane of lens 108. The diffracted signal beams incident upon photodetector array 109 are thus each proportional to the two-dimensional (2D) correlation between the search key page and each stored data page. In the case of thick holograms, due to Bragg selectivity, the correlation signals produced by each hologram are reduced to spatially separate 1-D correlation signals along the Bragg degenerate direction, i.e. the direction perpendicular to the plane formed by the set of reference beams and by the normal to the holographic data storage medium.

The holographic system described above can be utilized both for storing and searching for content-similar holographically stored data. However, optimization of a holographic system for storage and for search requires optimization of different sets of parameters between which exist tradeoffs, making it difficult to optimize both functionalities simultaneously. As an example of such tradeoffs, storage capacity maximization is generally accomplished by increasing storage density while maintaining a low but sufficient signal to noise ratio, whereas high search throughput and precision requires a high signal to noise ratio.

Furthermore, correlative searching requires different methods for modulation encoding and mapping of data onto a data page than for digital data holographic storage and retrieval. For example, in order to produce a direct comparison operation simultaneously over multiple data attributes, which can be viewed as equivalent to a database search based on a multiple field query, data can be preferably organized into a two-dimensional array of fixed width fields, each field representing a data attribute, and where each array occupies a data page. The data values are encoded as a pixellated pattern composed of one or more pixels forming either a linear array or a two-dimensional block centered at an ordinate position along the direction orthogonal to the plane formed by the object and the array of reference beams.

The above example is intended to highlight the dependency between the characteristics of the stored data, i.e. the number of its descriptive attributes, the type and complexity of search operation required, i.e. the number of attributes forming the search criterion, and the particular data encoding configuration best suited for storing the information data and presenting the search query.

Holographic correlative search is therefore more suited for parallel searches of all similar instances of structured data sets within large databases, where stored data sets are already organized in a structured representation optimized according to the specific correlative search operations required.

In addition, because the correlation operation is analog, meaning it is performed prior to any electronic signal detection, conversion and post-processing, bit-level digital thresholding and error correction is not available to improve the signal to noise ratio of the system. Furthermore, because the correlation signal represents the sum of the parallel correlation operations over the full data page, for data pages containing approximately 1 million raw bits, the correlation signal intensities dynamic range, which can be up to 60 dB between a single pixel and an exact page match, are bounded by the dynamic range and sensitivity of the detection as well as system noise. Optical contributions to system noise correspond to cross talk from other holograms also termed as inter-page crosstalk, as well as spurious or background cross-correlation signals due to the finite contrast of the SLM. The first contribution can be minimized by careful matching of the detector characteristics (e.g. pixel pitch and pixel size) to the angular separation between holograms, and mainly depends on the Bragg condition. In the second case, the finite contrast of the SLM limits the contrast ratio between "on" and "off" pixels in the stored data page holograms and also in the search page, thereby causing unwanted signals due to diffraction of the search page non-zero level "off" pixels by the stored "on" and "off" pixels, and conversely, diffraction of the search page "on" pixels off of the stored "off" pixels. The system limitations in combination with the optical noise means that there is only a limited range of values available in order to distinguish similar keys, thus generally preventing the system from distinguishing differences of a single or small number of bits between pages. The noise floor also imposes a lower limit on the number of matching pixels necessary to produce a detectable correlation signal and, correspondingly, a limit on the minimum number of feature-representing pixels on which a search is performed, i.e. a limit on the size of the search key.

What is needed is an improved holographic search system capable of maintaining high signal to noise ratio and high signal intensities independently of search key size for increased throughput, thus also allowing the use of smaller storage and search features for better discrimination and higher storage capacity. What is also needed is a holographic storage method which takes into account the specificities of a holographic search to provide higher storage density and increased search parallelism without requiring an increase in the number of elements and in the complexity of the holographic search system.

SUMMARY OF THE INVENTION

The present invention provides a content-addressable optical data storage and search system architecture primarily optimized with respect to search performance. The present invention also provides an optical data storage method of a content-addressable optical memory for content-addressable search of data stored in an optical data storage medium. The storage method of the present invention utilizes content-organization of data for providing an increase in storage density as well as improvement with regard to either signal detection or detection channel density.

According to a first aspect of the invention, a data search is performed not directly on original data itself, but on a holographically stored structured descriptive representation thereof, while a bit wise faithful representation of the original data itself is stored on a different data storage medium optimized for capacity and low bit-error rate retrieval.

Structured data upon which the search is performed comprises metadata, representing a description of data records. A set of distinguishing features is extracted from the entire data repository to form an orthogonal basis of descriptive elements. Each record of the plurality of records comprising the database is described by a set of values associated with each feature, the set of which can be efficiently organized into and holographically stored as a data page.

A holographic optical correlator system is provided with several novel features, which either considered individually or as a combination thereof result in performance improvement of the holographic correlator. As a first feature, the invention uses phase modulation for encoding both data storage and search pages to reduce the correlator system noise and increase the dynamic range of the detection system. A second feature of the invention consists in the use of heterodyne detection, irrespective of the data modulation method employed, to provide amplification to the plurality of correlation signals by modulation thereof by a plurality of reference beams. According to a further aspect of the invention, a storage method is provided which organizes and stores data according to its content to achieve an improvement in the storage capacity of a holographic content-searchable database and in the performance of the holographic correlator. The method comprises pre-sorting data according to content and employing a content-addressable storage method for storing the data.

In a first exemplary method, data pages with similar or related content are recorded as a cluster of at least one contiguously multiplexed page stored in at least one contiguous storage location in the holographic data storage medium. This improves the search speed, by reducing the number of storage locations to be accessed and searched in order to retrieve all relevant records.

A second method comprises contiguously storing and increasing the multiplexed storage density of content similar data beyond that allowed by the orthogonality condition of the holographic multiplexing method employed for storing the content-addressable database. At least one correlation signal from at least one contiguously multiplexed stored data page interferes constructively to produce an aggregated signal intensity enhancement along at least one detection channel path. The advantages derived from this method comprise an increase in storage density as well as higher search system throughput and sensitivity.

When used in conjunction with an orthogonal phase encoding method for data encoding, a third content-addressable storage method comprises contiguously multiplexed storing content-unrelated data and increasing the multiplexed storage density beyond that allowed by the orthogonality condition of the holographic multiplexing method employed for storing the content-addressable database. In this method, each at least one of at least one contiguously stored content-unrelated and mutually uncorrelated page is capable of producing a correlation signal along a same detection path. However, in response to a single search page, only one correlation signal from one among the at least one mutually content-unrelated contiguously stored data pages is produced and detected.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
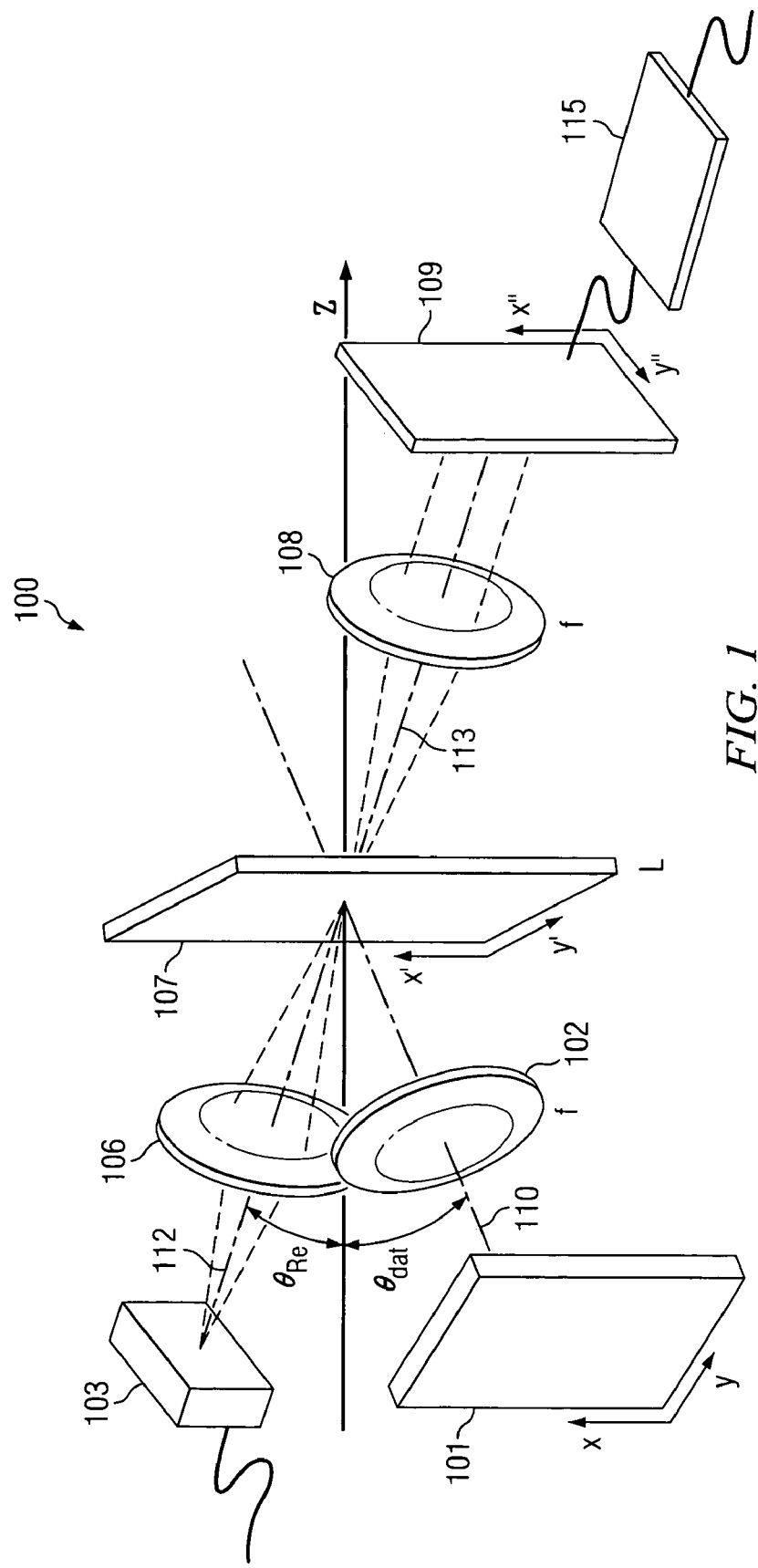
FIG. 1 illustrates a prior art Vander Lugt optical correlator for content-addressable search of a holographic database to assist in explaining the present invention.

To circumvent the tradeoffs existing between storage capacity and search signal-to-noise ratio and throughput, and also the tradeoffs between the data page encoding techniques required to optimize storage capacity for address-based data storage and retrieval systems on the one hand, and those required to optimize holographic correlative search systems on the other hand, the present invention provides a content-addressable optical data storage system architecture which is primarily optimized with respect to search performance.

In a first aspect of the invention, a method for searching for data is provided whereby the search is performed not on the original data itself, but on a holographically stored structured representation thereof, while a bit-wise faithful representation of the original data itself is stored on a different data storage medium optimized for capacity and low bit-error rate retrieval.

An exemplary embodiment of structured data upon which the search is performed comprises metadata. Metadata forms a structured data set used to describe and characterize an original data record. The metadata may represent a reduced version of the original data record, representing a set of relevant features describing the content of the data record, but not necessarily so, in which case it is also termed as content metadata. The metadata set for each data may also be larger than the original data record, and in general may encompass information not only about the data's content, but also its context and its structure, and therefore may also include details about the source and history of the data record, its purpose as well as its relationship to other data records, the frequency of system access to the data record, etc.

For the purpose of generating content metadata, a set of distinguishing features may be extracted from an entire data repository, also referred to as a database, so as to form a set of content attributes to characterize each data record. To each record of a plurality of records comprising the database is assigned a set of values associated with each attribute, which set of values can be efficiently represented as a two-dimensional array in a data page structure. The values may represent an intensity value to indicate the degree of relevance of the data record with respect to the attribute. Specifically, the degree of relevance may be ascertained as a weighted combination of several factors such as frequency of occurrence and ascertained relative degree of importance of the attribute in the data record. The values may also represent a logical relationship (dependent upon, cause and effect) to an attribute or even between attributes. The values may also be non-numerical and may represent different sub-categories or distinguishable concepts ascribed to a same general attribute. For example, when describing a technical text record, such as a text book on "magnetic data storage", a possible relevant attribute for categorizing its content may be "data storage", and the encoded value may indicate the type of technology, in this case "magnetic". In describing a text record on "child behavior", relevant attributes for describing the content of the document may include categorical attributes "medicine" and "social sciences" and encoded values may represent specific pertinent areas such as "preventive", "education", and "social development".

According to the invention, a holographic correlator provides a hardware-specific meta-search tool for searching for content-related data, where the search operation is performed upon the holographically stored metadata describing the original data records, and where multiple holographically stored metadata pages can be simultaneously compared to a metadata search key, with a resultant output consisting of pointers to a sub-set of data records, representing a small fraction of the total number of data records contained in the database.

The metadata associated with a single data record may be encoded and holographically stored as one of a single data page or of a plurality of data pages.

FIG. 1 illustrates a prior art Vander Lugt optical correlator for content-addressable search of a holographic database. Its principles of operation were described previously and are reiterated here in order to facilitate the description of the invention. An object beam 110 is encoded by spatial light modulator (SLM) 101 with a search data page and is incident upon lens 102, which illuminates a single data site in holographic data storage medium 107 with the two-dimensional spatial Fourier transform of the SLM image. Holographic data storage medium 107 comprises a plurality of data sites, each data site storing a plurality of angle multiplexed data holograms. Each hologram records the intensity interference pattern produced by interfering a given reference beam reflected by scanning mirror 103 with the two-dimensional spatial Fourier transform of a given data page. Each simultaneously illuminated hologram produces a diffracted beam 113 in the direction of its reference recording beam 112, and proportional in amplitude to the product of the search key and stored data page Fourier transforms. The diffracted beams 113 are focused by lens 108 placed along the reference beam arm path, undergoing in the same process an additional two-dimensional spatial Fourier transform, and subsequently illuminate a two-dimensional photodetector array 109 placed in the front focal plane of lens 108. The diffracted signal beams incident upon photodetector array 109 are thus each proportional to the two-dimensional (2D) correlation between the search key page and each stored data page. In the case of thick holograms, due to Bragg selectivity, the correlation signals produced by each hologram form an array of spatially separate 1-D correlation signals oriented along the Bragg degenerate direction, i.e. the direction perpendicular to the plane formed by the set of reference beams and the normal to the holographic data storage medium. This is the result of Bragg selectivity afforded by thick holograms, which reduces the shift invariance generally associated with optical correlators, in the Bragg selective direction.

In order to obtain separation of correlation signals upon incidence onto the detector array 109 of the correlator, the design constraints include setting the pixel pitch and pixel size of the detector array such that correlation signals of adjacent pages impinge on adjacent pixels along the Bragg selective dimension, without any overlap. This can be achieved, for example, by setting the first or second Bragg null of each signal to coincide with the center of the adjacent pixel detector. Under these conditions, the optical system performs a highly parallel analog operation, whereby the signal output corresponding to a single search key at a given pixel (p",q") of the output detector array can be described as:

$$I_{Diff}(p'', q'') \propto \left| \sum_r \sum_{\tilde{p}} \sum_{\tilde{q}} D*(p'' + \tilde{p}, q'' + \tilde{q} - \hat{r}, \hat{r}) K(\tilde{p}, \tilde{q}) \delta[q'' - \hat{r}] \right|^2$$

in intensity, $$\propto \left| \sum_{\tilde{p}} \sum_{\tilde{q}} D*(p'' + \tilde{p}, \tilde{q}, q'') K(\tilde{p}, \tilde{q}) \right|^2 \text{ and}$$

$$A_{diff}(p'', q'') \propto \sum_{\tilde{p}} \sum_{\tilde{q}} D*(p'' + \tilde{p}, \tilde{q}, q'') K(\tilde{p}, \tilde{q})$$

in amplitude, where $D(p,q,r)$ represents a data page encoded by a spatial light modulator (SLM), with p and q representing the position coordinates of individual pixels in the Bragg degenerate and Bragg selective dimensions, respectively, and stored at various reference beam settings r (e.g., the recording angle when angular multiplexing is used); where $\delta(x)$ is the Kronecker delta function defined by $\delta(0)=1$ and $\delta(x)=0$ for $x \neq 0$, and representing the above mentioned design constraint, namely that the signals diffracted from each hologram impinge on a single pixel column, without any overlap.

Thus, when a search query $K(p,q)$ is placed on the SLM, an output is simultaneously computed on the 2D detector array. This 2-D output signal is constituted of an array of 1-D signals, each representing 2 dimensional product operation, i.e. a 1-D correlation product (in p) along the Bragg degenerate direction and an inner product (in q) along the Bragg selective direction, between the search key page and a given stored data page, and calculated in parallel for all pages (r). Signals incident on the pixels situated in the same plane as the reference beams array plane correspond to a 2-D inner product, which characterizes the match between the search key and the un-shifted stored data pages, whereas the signal output to a pixel (p", q") of column q" corresponds to the cross correlation of the key page with the shifted (by p" rows in the Bragg degenerate direction) $q''^{th}$ data page.

The above example is intended to highlight the dependency between the characteristics of the stored data, i.e. the number of its descriptive attributes, the type and complexity of search operation required, i.e. the number of attributes forming the search criterion, and the particular data encoding configuration best suited for storing the information data and presenting the search query. The properties of the comparison operations forming the correlation signal, coupled to the characteristics of the stored data, i.e. the number of its descriptive attributes, and also to the type and complexity of search operation required, i.e. the number of attributes forming the search criterion, determine the preferred data organization of the data page encoding.

In an exemplary case where the data to be stored and subsequently queried is described by multiple independent attributes, and where the search parameters comprises any one or more of the data attributes, the metadata attributes are optimally organized as and encoded within fixed width blocks, the width of the blocks corresponding to the number of pixel elements along the Bragg direction used to encode each attribute, while the arguments or values of each attribute are encoded as a linear array or a two-dimensional block of pixels orientated along the Bragg degenerate direction.

In a second aspect of the invention, the remaining shift invariance in the Bragg degenerate direction is used to perform similarity and comparison search operation between search key and stored data. Shift invariance causes matching between key and shifted (along the Bragg degenerate direction) page pixels to produce a shift in the position of the correlation peak along the Bragg degenerate direction while its intensity remains constant. The shift herein can be used to measure the difference between search key and stored value.

Figure 2:
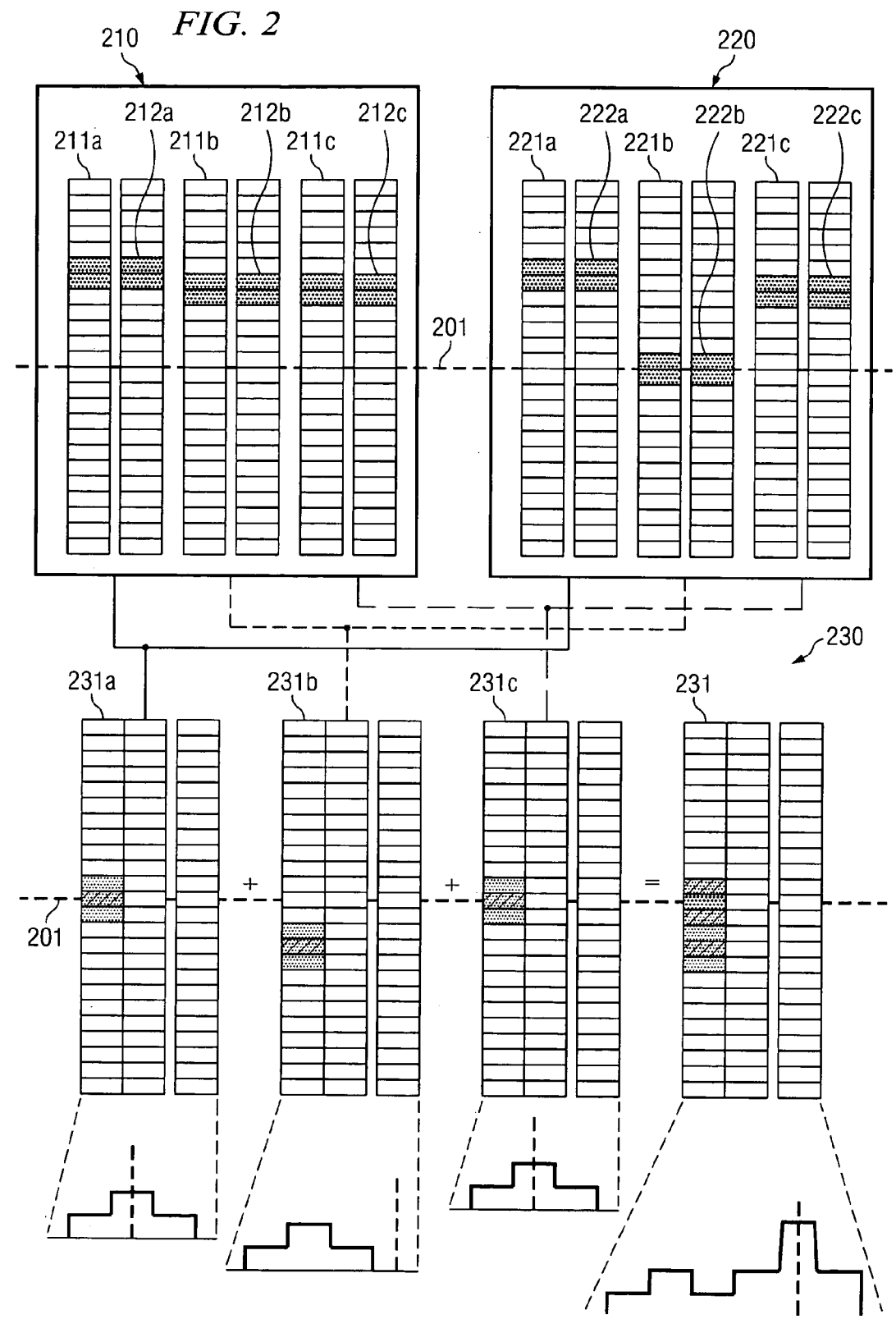
FIG. 2 illustrates an exemplary data encoding arrangement of search and stored data pages, where the relative spatial shift between search and stored data patterns indicates differences between data values and translates into a measurable skewing or position shift of the correlation signals, to assist in explaining an aspect of the present invention.

FIG. 2 illustrates an exemplary data encoding arrangement of search and stored data pages, where the relative spatial shift between search and stored data patterns indicates differences between data values and translates into a measurable skewing or position shift of the correlation signals, to assist in explaining an aspect of the present invention. With reference to FIG. 2, a search key page 210 and a stored data page 220 are respectively divided into spatially separate regions 211a to 211c and into regions 221a to 221c. In the following, the description of the data arrangement refers specifically to data page 220, but is also intended to represent the data arrangements of the search page 210. With reference therefore to the data page 220, a data attribute is assigned to each region 221a to 221c—to maintain the clarity of the illustration, only three regions are depicted, without any intention of limitation in the number thereof—and the associated data arguments are encoded in the form of pixellated data patterns 222a to 222c representing a data block occupying the full width of the region. Depending on the nature of the data, the data argument may comprise a singular numerical value, and may be represented by a minimum block size characterized by a block height of at least one or more pixel, and an ordinate position within the region. The data argument may also comprise a continuous range of numerical values, bounded by a lower and upper limit, represented by a greater block height, which may be one of an integer and a fractional multiple of the minimum block height associated with a discrete numerical value. The data argument is not necessarily numeric, and the pixellated data pattern may also represent a logical relationship. Alternatively, the data pattern may represent a given concept among a collection of concepts used to represent diverse areas of a common subject class, such as used in a library indexing catalog.

The search page 210 is encoded similarly and illuminates the data page 220. A diffracted correlation signal 231 is generated and is incident on a single pixel column of a photodetector array 230. The correlation signal 231 can be decomposed as the linear combination of signals 231a (to 231c) arising from the correlation between Bragg-matched regions 211a (to 211c) of the search page 210 and 221a (to 221c) of the data page 220.

As depicted in FIG. 2, patterns 212a and 212c of the search page overlap, respectively, with patterns 222a and 222c, producing diffraction signals centered in the Bragg plane 201, whereas pattern 212b of the search page 210 is shifted compared to pattern 222b of the data page 220, producing a correlation signal shifted with respect to the Bragg plane. Whereas traditionally the intensity of the correlation peak on the pixel situated in the Bragg plane provides a measure of the exact match between a search page and a stored data page, in the present invention, the magnitude of the spatial shift in position of the correlation signal peak provides a means for measuring the "difference" between the search key and data values.

Still referring to FIG. 2, the various signal contributions 231a to 231c combine to produce a correlation signal 231 with an asymmetric skewed profile, indicative of a combination of perfect matches between certain data attributes among a plurality of data attributes contained in a data page, and of differences between the remainder of the data attributes. Therefore, in the case where the search page and the data page contain a plurality of data attributes, each encoded within a different one of a plurality of data regions, the spatial characteristics of the overall correlation signal 231 (i.e. its width, central position and asymmetry) are a function of the characteristics and also of the relative match between search and stored data patterns.

In the following, several cases are considered in order to better understand the effect of these different factors on the correlation signal profile. In the case where the data patterns pertaining to different regions of the data page are identical to those in the corresponding Bragg matched regions of the search page, except for an overall spatial shift between them, then the correlation signal is symmetric and presents a shift with respect to the center pixel of the pixel column. In the case where only certain regions among the plurality of regions present shifted data patterns between the stored page and the search page, this produces a complex profile generally characterized by a skewing of the overall correlation signal, and the appearances of side lobes on one or both sides of a principal intensity peak. In instances where the data page and search page attributes exhibit multiple differences of varying magnitudes, the correlation signal may also comprise multiple spatially separate intensity peaks.

Upon detection of the complex profile by the photodetector array, and by using a priori knowledge of the data encoding patterns, i.e. their size, and of their associated autocorrelation profiles, signal processing and data fitting techniques known to one ordinarily versed in the art can be applied to determine the number of shifted autocorrelation signal contributions, their relative intensities as well as their relative shifts.

Furthermore, the data contained in the stored data page 220 may comprise one or more data patterns of a size different from the size of the pattern encoded on the corresponding Bragg matched region of the search page. As described previously, the data arguments associated with each data attribute may be encoded as a data pattern comprising a block of fixed width, but potentially variable height-depending on whether the data argument represented is a singular value or a range of values.

In this case, the shifted correlation signals may exhibit different correlation profiles depending on whether the correlation occurs between data patterns of identical or different heights. For example, when considering the rectangular data patterns displayed in FIG. 2, the correlation signal intensity profile between patterns of identical heights is a triangular function, whereas the correlation signal intensity profile between patterns of different heights is a trapezoidal function.

In order to identify which individual data patterns comprised in the stored data page present differences with their respective search patterns in the search page, a further embodiment of the invention may comprise a sequence of multiple searches, where upon identification of discrepant characteristics of the correlation signal during a first search, subsequent searches are conducted with subsequent encoded search pages comprising only a fraction of the search data patterns comprised in the search page of the immediately preceding search step.

The scope of application of the second aspect of the invention encompasses the parallel search and comparison of any type of data whose features can be stored as an array representing a set of different attributes to which are associated a single or a range of numerical values. This includes but is not limited to, product specifications and data sheets, financial reports, test data arrays for statistical process control, etc. The invention provides a mechanism to compare data arrays to a search array and ascertain the number of exactly matching, lesser and superior, values, compared to an array of target values forming a "target" search array. Using an iterative procedure, discrepant values among an array of values may be individually identified. Alternatively the method can be adapted to determine whether large sets of values forming in data arrays fall within a template array or region of interest (ROI).

In a third aspect of the invention, phase modulation is used for encoding the stored data pages and search data page. When using an SLM constituted of M×N pixels, organized in M rows by N columns, $D(p,q)=t_{pq}$, $$t_{pq} \in \left\{\frac{1}{CR}, 1\right\}$$

in the case of amplitude modulation, or $D(p,q)=\cos(\phi_{pq})$, $\phi_{pq} \in \{0,180°\}$ for phase modulation, where $t_{pq}$ represents the field amplitude transmission of an amplitude encoding SLM, CR represents the contrast ratio of the SLM, and $\Phi$ represents the phase variation caused by a phase modulating SLM.

If $N_{key}$ is the number of "on" pixels in the search key $K(p,q)$, and $N_{match}(p'',q'')$ is the number of matching pixels between the search key and $q''^{th}$ shifted (by $p''$ rows) stored data page, then the diffracted correlation signal intensity is given by:

$$I_{Diff}(p'', q'') = \eta_{fill}\left(\frac{M\#}{M_{page}}\right)^2 \frac{N_{match}^2(p'', q'')}{(MN)^2} I_0,$$

where $I_0$ is the object beam intensity incident upon the SLM, $\eta_{fill}$ is the SLM fill factor, $(M\#/M_{page})^2$ is the hologram page diffraction efficiency, assumed to be constant, with M# being the holographic data storage material dynamic range metric and $M_{page}$ constituting the number of overlapping multiplexed page holograms.

When using amplitude modulation, the finite contrast causes the "off" pixels to still transmit a small amount of light resulting in a reduction of the contrast of the stored digital page holograms, and of the search key. This results in optical crosstalk noise due to the diffracted signal arising from the diffraction of "on" and "off" pixels by stored "off" pixels, and also of "off" pixels by stored "on" pixels, which is given by:

$$I_{Noise} = \eta_{fill}\left(\frac{M\#}{M_{page}}\right)^2 I_0 \frac{\left[(MN - N_{key})\left(b - \frac{N_{match}}{MN}\right) + (N_{key} - N_{match}) + \frac{(MN - N_{key})(1-b)}{CR}\right]^2}{CR^2(MN)^2}$$

where b is the code balance or ratio of the number of stored "on" pixels by the total number of pixels MN. The optical signal to noise ratio SNR is then given by:

$$SNR_{AM} = \frac{CR^2 N_{match}^2}{\left[(MN - N_{key})\left(b - \frac{N_{match}}{MN}\right) + (N_{key} - N_{match}) + \frac{(MN - N_{key})(1-b)}{CR}\right]^2}$$

$$= \frac{CR^2 N_{match}^2}{\left[(MN - N_{key})\left(b - \frac{N_{match}}{MN}\right) + (N_{key} - N_{match})\right]^2},$$

Taking into account that current SLMs achieve 30 dB of contrast ratio in intensity, SNR is maximum for $N_{match}=N_{key}$, in which case $SNR_{AM}$ is reduced to:

$$SNR_{AM}^{Max} = \frac{CR^2 N_{key}^2}{(MN - N_{key})^2\left(b - \frac{N_{key}}{MN}\right)^2} = CR^2 \frac{N_{key}^2}{(MN)^2} \frac{1}{\left(1 - \frac{N_{key}}{MN}\right)^2\left(b - \frac{N_{key}}{MN}\right)^2}$$

For small search keys, the maximum SNR is roughly quadratically proportional to the ratio of key size to SLM size, and falls below 1 for $N_{Key} < MN/(b*CR)$. Even without considering other noise sources such as detector noise or pixel shift, this effectively limits the minimum number of "on" pixels necessary to produce an acceptable signal to noise ratio. Previous methods for overcoming the signal strength and signal to noise ratio limitations, such as proposed in U.S. Pat. No. 6,205,107, have either come at the cost of capacity, by employing a large number of pixels to encode each single bit thus increasing signal strength and thereby creating a large overhead, and use a combination of amplitude modulation for data encoding overlaid by periodic phase modulation to reduce the dark signal originating from "off" pixels.

Instead, the present invention uses phase modulation for encoding both data and search pages. In a preferred embodiment, the invention uses DC balanced and orthogonal phase codes for encoding of data and search pages.

In a preferred example, orthogonal phase codes comprise deterministic orthogonal phase codes, known as Walsh-Hadamard codes, which can be generated using Hadamard matrices. Hadamard matrices of rank $2^n$ are constructed from the lowest rank (n=1) Hadamard matrix $$H_2 = \begin{pmatrix} 1 & 1 \\ 1 & -1 \end{pmatrix},$$

using the following recursive construction method:

$$H_{2^{n+1}} = \begin{pmatrix} H_{2^n} & H_{2^n} \\ H_{2^n} & -H_{2^n} \end{pmatrix}.$$

Hadamard matrices have the following important properties that their rows (or columns) form orthogonal $2^n$-element vectors $r^{(m)} = \{r_p^{(m)}\}$, $p \in [1, 2^n]$ with respect to their dot product, such that $$\sum_{p=1}^{p=2^n} r_p^m r_p^{m'} = 2^n \delta_{mm'}.$$

Except for the first vector which is uniform, these vectors represent DC-balanced codes, with an equal number of "1" and "−1". By excluding the first vector, there exists $2^n-1$ DC balanced orthogonal vectors. The length of the code used is determined by the SLM size, which preferably should be of the form $2^n \times 2^n$ In the case of 1024×1024 SLM, the code length is 1024=$2^{10}$, and the orthogonal codes are derived from the Hadamard matrix of rank 10.

Figure 3:
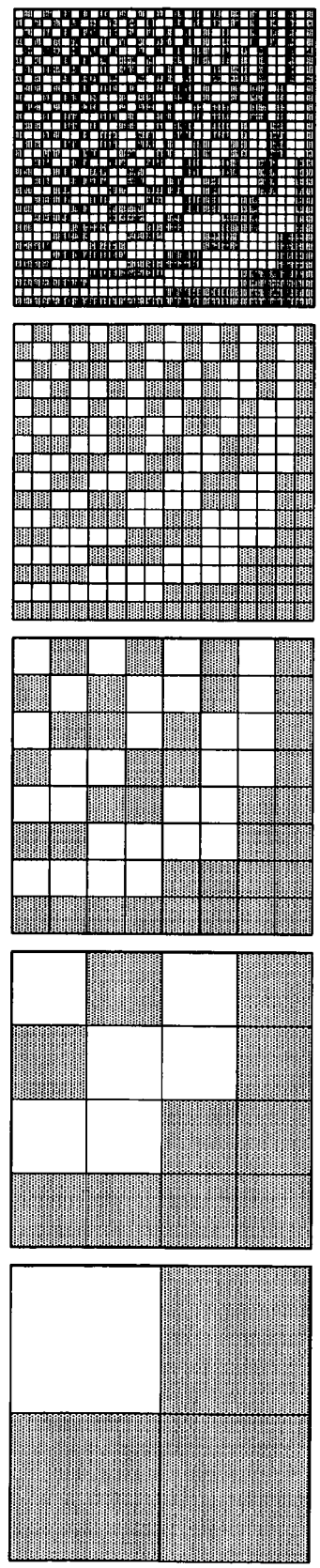
FIG. 3 shows an exemplary list of the first four Hadamard matrices of rank 2, 4, 8, and 16, respectively, used for generating orthogonal phase codes, and a 2-dimensional graphical representation of the corresponding matrices.

FIG. 3 shows an exemplary list of the first four Hadamard matrices of rank 2, 4, 8, 16 respectively, and a two-dimensional graphical representation of the corresponding matrices. In a first embodiment, each metadata attribute is represented as a single column of the SLM, the argument of which is encoded as one of the orthogonal codes.

For an N×M SLM, where the number of rows N is equal to the $n^{th}$ power of 2, there exists N−1 orthogonal N-length codes, which can be used to encode N−1 distinguishable data bits attributable to each attribute, with a coding overhead of (N−1)/N nearly equal to 1, and up to M attributes, thus giving a user page capacity of (N−1)×M.

In this case, $D(p,q) = r_p^{m(q)}$ $$I_{Diff}(p'', q'') = \eta_{fill} \left(\frac{M\#}{M_{page}}\right)^2 \frac{\left|\sum_{\tilde{p}} \sum_{\tilde{q}} (r_{p''+\tilde{p}}^{m(\tilde{q})}(q'')) * r_{\tilde{p}}^{m'(\tilde{q})}\right|^2}{(MN)^2} I_0$$

$$\text{For } p'' = 0, \; I_{Diff}(0, q'') = \eta_{fill} \left(\frac{M\#}{M_{page}}\right)^2 \frac{\left|\sum_{\tilde{p}} \sum_{\tilde{q}} (r_{p''+\tilde{p}}^{m(\tilde{q})}(q'')) * r_{\tilde{p}}^{m'(\tilde{q})}\right|^2}{(MN)^2} I_0$$

$$= I_S \left|\sum_{\tilde{q}=1} N \delta_{m(q)m'(q)}\right|^2,$$

where $I_S = \eta_{fill}\left(\frac{M\#}{M_{page}}\right)^2 \frac{I_0}{(MN)^2} = \frac{\eta_{fill} I_{pix}}{MN}$, with $I_{pix} = \left(\frac{M\#}{M_{page}}\right)^2 \frac{I_0}{MN}$ representing the intensity incident upon a single pixel of the photodetector array during data page readout. When employing orthogonal phase encoding, the signal strength is maximized as all SLM pixels are used simultaneously to represent each bit value for each attribute and contribute collectively to the diffracted correlation signal. Upon examination of the diffracted correlation signal intensity, it is proportional to the signal associated with a single column, $NI_0$, multiplied by the number of columns containing a code identical to the search code in the same column of the search page. In other words, the correlation signal intensity is the product of the number of matching attributes among the searched features by the correlation signal intensity associated with an individual search attribute. In the case where there is no match between search page and data page, then the diffracted signal intensity is zero, due to the orthogonality condition. When performing a search on a limited number of features, the uniform code $r^{(1)}$ composed only of "1" can be used in the columns representing the attributes not searched upon, as this code is also orthogonal to all the DC-balanced code $r^{(m)}$ used to encode the attributes of each stored metadata page. This enables to reduce the search size to a single attribute, without any degradation in signal to noise ratio.

In practice, phase imperfections and unequal transmission between individual pixels of the SLM can contribute to degrade the orthogonality condition, and result in signal noise. These are generally predominantly attributable to variations in the pixel thickness across the SLM. However, the effect of these imperfections can be efficiently reduced, for example by use of an additional amplitude mask to compensate for SLM transmission non-uniformities, and through system calibration procedures, for instance by measuring and recording the averaged cross-correlation noise over all codes, and subtracting it using electronic signal processing.

An alternative example of orthogonal phase codes comprises pseudo-random phase codes, which present the additional advantage of being relatively tolerant to phase errors introduced by the spatial light modulator.

In a fourth aspect, the invention provides a method for improving the detection of the correlation signals, by the use of heterodyne detection. Heterodyne detection is typically used for coherent phase detection schemes and comprises aligning a signal beam with a reference beam and coherently-mixing the two, resulting in a mixed signal proportional in amplitude to the phase of the signal beam.

Figure 4:
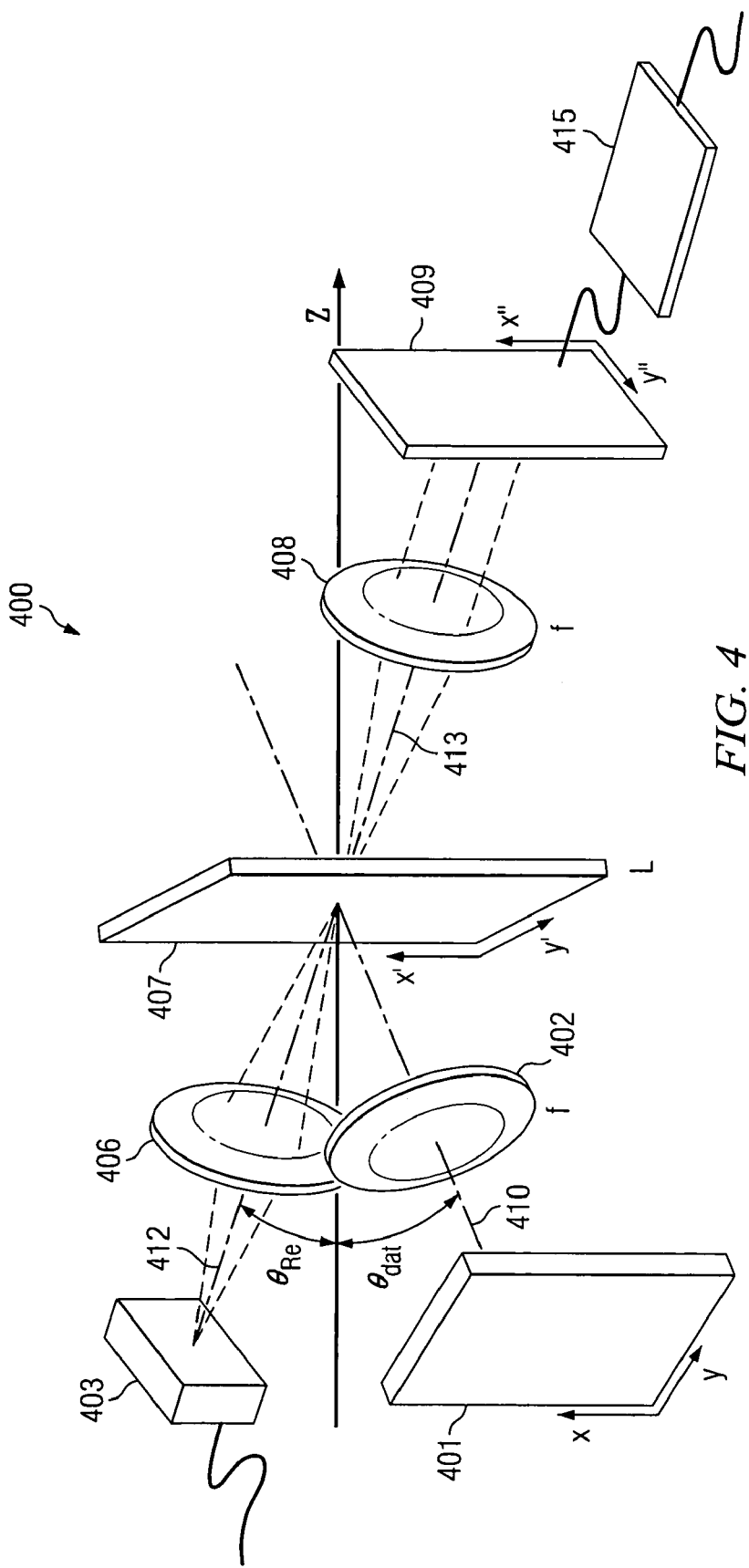
FIG. 4 illustrates a heterodyne Vander Lugt optical correlator for content-addressable search of a holographic database according to a preferred embodiment of the present invention.

FIG. 4 illustrates a heterodyne Vander Lugt optical correlator for content-addressable search of a holographic database according to a preferred embodiment of the present invention. The optical correlator is generally designated by reference number 400 and comprises a modified Vander Lugt correlator, which incorporates heterodyne detection to amplify and implement linear detection (in amplitude) of the correlation signals. FIG. 4 is similar to FIG. 1, and employs similar reference numbers for corresponding components, except that scanning mirror 103 in FIG. 1 is replaced by acousto-optic deflector 403 in FIG. 4. As described previously, object beam 410 is encoded by SLM 401 with a search data page and is incident upon lens 402, which illuminates a single data site storing a plurality of angle multiplexed data holograms in holographic data storage medium 407 with the spatial Fourier transform of the SLM image. Each simultaneously illuminated hologram produces a diffracted beam 413 in the direction of its reference recording beam proportional in amplitude to the product of the search key and stored data page Fourier transforms. The diffracted beams then undergo a second Fourier transform by lens 408, placed along the reference beam arm path and each illuminate a different pixel column of two-dimensional photodetector array 409. The acousto-optic deflector 403 serves to simultaneously generate and frequency shift a plurality of reference beams 412 identical to the plurality of recording reference beams used to record the multiplexed page holograms, except for the frequency shifts imparted to each of them. The plurality of reference beams interfere with the diffracted correlation signals, to produce a diffracted signal on photodetector array 409, now given by:

$$I_{Diff-HD}(p'', q'') = \left| \begin{array}{l} \sqrt{I_S} \sum_{\tilde{r}} \sum_{\tilde{p}} \sum_{\tilde{q}} D * (p'' + \tilde{p}, q'' + \\ \tilde{q} - \hat{r}, \hat{r}) K(\tilde{p}, \tilde{q}) \delta[q'' - \hat{r}] + E_R(\hat{r}) e^{i\omega(\hat{r})t} \end{array} \right|^2$$

$$= \left| \begin{array}{l} E_R(q'') e^{i\omega(q'')t} + \\ \sqrt{I_S} \sum_{\tilde{p}} \sum_{\tilde{q}} D * (p'' + \tilde{p}, \tilde{q}, q'') K(\tilde{p}, \tilde{q}) \end{array} \right|^2$$

$$\approx |E_R(q'')|^2 + 2\sqrt{I_S} \, E_R(q'') \cos[\omega(q'')t] \sum_{\tilde{p}} \sum_{\tilde{q}} D *$$

$$(p'' + \tilde{p}, \tilde{q}, q'') K(\tilde{p}, \tilde{q})$$

Preferably, the photodetector array is configured to filter out the DC bias resulting from the use of the coherent phase-shift detection system, in which case the detected signal intensity is given by:

$$I_{\text{Diff\_HD}} = 2\sqrt{I_S}\, E_R(q'')\cos[\omega(q'')t]\sum_{\tilde{p}}\sum_{\tilde{q}} D*(p''+\tilde{p},\tilde{q},q'')K(\tilde{p},\tilde{q}),$$

and the gain G is given by:

$$G = \frac{I_{\text{Diff\_HD}}}{I_{\text{Diff}}} = 2\sqrt{\frac{I_R}{I_{\text{Diff}}}}$$

To obtain a heterodyne detection correlation signal equal to the direct detection signal, a smaller number $$N_{\text{key-HD}} = \frac{N_{\text{Key-DD}}}{G}$$

of matching pixels are necessary.

According to the present invention, the use of heterodyne detection provides a mechanism for amplifying the correlation signals to improve the dynamic range and the throughput of the correlator system, independent of the encoding method. On the one hand, the gain provided to the correlation signal enables to employ smaller search keys while maintaining the signal to noise ratio (SNR) and throughput, thus providing the correlators with better search resolution. On the other hand, the gain enables to amplify and detect weak correlation signals which in a direct detection system would be below the noise floor, thus extending the search range. Similarly, gain adjustment can also be used for dynamically changing search keys to distinguish between similar results. For example, when the search involves multiple search keywords or criteria, distinguishing between similar results is made possible by repeating the search while restricting it to each individual criterion and adjusting the gain provided by the heterodyne reference beams to compensate for the smaller correlation signal strength, thus providing additional discrimination capabilities between similar matches.

A further aspect of the invention takes advantage of another feature derived from the use of heterodyne detection, namely that the correlation signal is now detected linearly, i.e. in amplitude. The linear detection offered by the heterodyne detection scheme can be further exploited by recognizing that each correlation channel (corresponding to each angular addressed page) path is now linear with respect to the detection, therefore allowing the performance of multiple searches in parallel, and the detection of the linear superposition of signals corresponding, respectively, to each individual search, which can be subsequently separated by a suitable electronic post-processing architecture. Code-division multiple-access techniques can be used to superimpose multiple queries over time, each using a unique orthogonal time code. Using codes of length $J=2^n$, $J-1$ orthogonal codes can be generated, which additionally have no DC content. Note that one exemplary embodiment of such codes is identical to the orthogonal phase codes, described previously and illustrated in FIG. 3. In the previously described aspect of the invention the orthogonal property of orthogonal phase codes was utilized to encode N−1 "distinguishable" data bits, using a N-element spatial pattern. Here the same codes are used to overlay multiple search patterns over time, by encoding each with a "distinctive" J time slots-long modulation pattern, and applying each of the J-element time patterns to the detected signals over N time slots, to recover the J−1 individual correlation results. All J−1 searches are performed in parallel, over a period of time JT, where T is as short as the SLM switching time, with each search being presented on the SLM for (J/2).T, with a speedup rate of (J−1)/2 for the same SNR as for a sequential sequence of J searches, also called time-division multiple access (TDMA). An additional advantage is that using balanced codes provide DC content blocking in time. This can be understood by the fact that un-modulated pixels will be blocked by the balanced time filter [1, −1].

A further aspect of the present invention concerns methods for organizing and storing data and in general for creating and structuring the holographic meta-databases for search efficiency. A first method comprises pre-sorting the extracted meta-data according to a selectable content relationship, and employing a content-addressable storage method for storing the meta-data, whereby meta-data pages containing related content with respect to the selected content relationship are recorded as a cluster of at least one page contiguously multiplexed stored in at least one contiguous location. This can further improve the search speed, by reducing the number of storage locations to be searched in order to retrieve all relevant records related to the search. In a preferred embodiment, the content relationship used to organize and store content related data as clustered data comprises content similarity. It is, however, understood that other content relationship criteria may be used to organize and store data as content related clusters, without departing from the scope and spirit of the principles of the method described above.

Furthermore, for holographic search, since the objective is not actual data readout, low bit error rate and minimal crosstalk do not constitute relevant metrics of the holographic correlator search system. On the contrary, in another method provided by the present invention, crosstalk can now be used to advantage by enabling the contiguously multiplexed storage of content-similar pages with a lower address spacing or higher address density than that allowed by the orthogonality condition of the holographic multiplexing method employed for storing the content-addressable database. Upon content-addressable readout of the at least one content similar contiguously multiplexed-stored data pages, they each produce a correlation signal along a same detection path, which in turn results in an aggregated signal intensity enhancement on the photodetector element.

In order to better understand the method of the present invention, let us consider the following exemplary embodiment, where angular multiplexing is employed for recording multiple pages to a same storage location. In the exemplary embodiment, the content-addressable storage method comprises recording content related data as at least one of a plurality of contiguous angular addressed pages with angular separations substantially less than that dictated by the Bragg condition, resulting in multiple correlation signals contributing constructively to a same correlation signal to produce a signal intensity enhancement on each column of the photo-detector array for a given search key.

In this approach, a priori knowledge of content similarity between meta-data pages is utilized to decrease the address separation between contiguous multiplexed stored data pages below that required by the orthogonality condition for low crosstalk address-based data readout. The orthogonality condition is expressed in a different form depending on the multiplexing technique considered. As an example, its expressions for angular, wavelength and shift multiplexing comprise, respectively, minimal angular, wavelength, and relative spatial shifts between adjacent reference addresses.

The dense clustering of contiguously multiplexing content related data pages produces cross-talk induced diffraction of their correlation signals along the same detection path. Contrary to holographic data storage and page-based data readout, the increased cross-talk is not detrimental in this case. The cross-talk from neighboring pages produces an increase in correlation signal intensity incident upon the photodetector element, and acts to simply reinforce the detection of a given page by increasing the likelihood of the detection of its correlation peak, as desired. This technique results in a higher storage density, and increased search parallelism and system throughput, at the expense of not being able to discriminate between individual content related records. However, the capacity to precisely discriminate between individual records is not the main goal of a holographic search system. As previously discussed, this task is better accomplished by a digital search system. Instead, high search throughput is the goal, and it is readily achieved using this data clustering technique. Moreover, the collective enhancement in signal strength also enables to decrease the code rate or SLM pixel block size used to represent a meta-data bit, which also results in an increase in meta-data page capacity.

According to a further aspect of the present invention, another approach to content-addressable storage can be adopted, which also uses a priori knowledge of content relationship between meta-data pages. When using an orthogonal phase encoding method to encode the meta-data page, as described previously, in the present invention, different content is represented by different orthogonal codes. From this, it can be seen that pages with entirely dissimilar content are represented by orthogonal page arrays, since the different data values associated to the same attribute in each page are represented by different mutually orthogonal codes. This in turn can be exploited for increasing storage density, search parallelism and system throughput, by storing meta-data pages representing unrelated or dissimilar content, contiguously, with a Bragg spacing (e.g. angular or wavelength spacing) less than the Bragg condition for low crosstalk.

When performing a search over a single feature, by illuminating the plurality of stored data pages at a given location with a given search page containing only a single encoded search feature—i.e. by encoding only one column with an orthogonal DC-balanced phase code, and all others with a uniform code—, only one data page among the plurality of orthogonally encoded data pages stored at the same angular position produces a correlation signal.

In contrast to the previous method utilizing content similar clustering of data pages to produce higher storage density and correlation signal enhancement, this aspect of the invention utilizes the properties of orthogonal phase modulation for data encoding as a multiplexing storage mechanism for storing unrelated or "uncorrelated" data along a common search channel.

Figure 5:
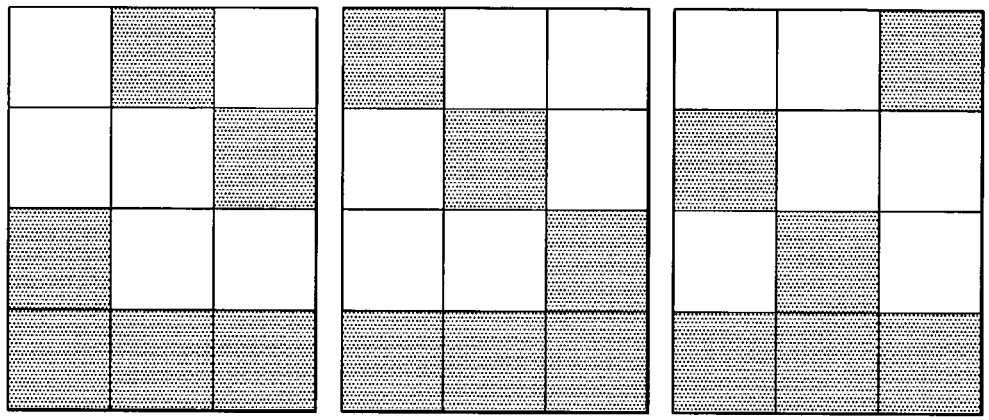
FIG. 5 illustrates, by way of example, orthogonal page arrays of size N=4 rows by M=3 columns constructed by permutation of the 4-length codes between the 3 columns of the pages.

FIG. 5 illustrates, by way of example, orthogonal page arrays of size N=4 rows by M=3 columns constructed by permutation of the 4-length codes between the 3 columns of the pages. As each column of each page must be orthogonal to the same column in a different page, the number of orthogonal pages that can be constructed in this manner is equal to the number of orthogonal codes.

For simple search queries involving a single attribute at a time, this technique results in several advantages; firstly, an increase in the storage density by a factor equal to the number of orthogonal DC-balanced phase codes, i.e. N−1 for an SLM composed of $N=2^n$ rows by M columns; secondly, a corresponding increase in throughput, by increasing the number of pages being simultaneously compared, without any increase in the photodetector array size or detection processing complexity, due to the clustering of "orthogonal" or unrelated pages along a same correlation path.

Figure 6:
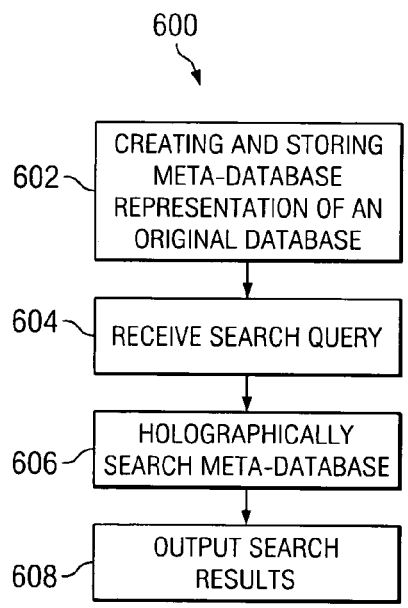
FIG. 6 is a flowchart that illustrates a method for creating and searching a meta-database according to a preferred embodiment of the present invention.

FIG. 6 is a flowchart that illustrates a method for creating and searching a meta-database according to a preferred embodiment of the present invention. The method is generally designated by reference number 600, and begins by creating and storing a meta-database representation of an original database in a holographic data storage medium (Step 602). The meta-database representation comprises a structured description of original data represented in the original database, each original data record being described as a set of numerical or logical values each associated with a different one of a set of distinguishing attributes extracted from the original database. In response to a search query (Step 604), the meta-database representation of the original database is then searched holographically (Step 606). Step 606 may involve one or more search iterations, and may comprise one or both steps of simultaneous search over multiple attributes and single attribute search. The search results are then output for presentation to a user (Step 608).

The description of the present invention has been presented for purposes of illustration and description, and is not intended to be exhaustive or limited to the invention in the form disclosed. The embodiments were chosen and described in order to best explain the principles of the invention, the practical applications, and to enable others of ordinary skill in the art to understand the invention for various embodiments with various modifications. Many modifications and variations will be apparent to those of ordinary skill in the art, without departing from the true spirit and scope of the invention.

The invention claimed is:

1. A method for storing a database for content-addressable search of data, comprising:
   providing at least one holographic data storage medium;
   providing an original database containing original data records;
   extracting a set of distinguishing features from the original database to form an orthogonal basis of descriptive elements;
   for each original data record, determining a set of values associated with each distinguishing feature;
   creating a metadata representation of the original database, the metadata representation comprising the sets of values for the original data records;
   storing the metadata representation of the original database in the at least one holographic data storage medium; and
   searching the original database by performing the search on the at least one holographic data storage medium.

2. The method according to claim 1, wherein storing the metadata representation of the original database in the at least one holographic data storage medium comprises:
   providing an object light beam and a reference light beam;
   encoding, by means of a spatial light modulator, the metadata representation as at least one data page spatially modulating the object light beam; and
   holographically storing the metadata representation by interfering each data page encoded object light beam with a different reference light beam at a data storage location within the at least one holographic data storage medium.

3. The method according to claim 2, wherein encoding comprises:

phase modulation encoding of data; and arranging and encoding each set of values as a phase modulated data pattern on a different one of a plurality of spatially separate tracks comprised in the spatial light modulator, of at least one pixel width and oriented perpendicularly to a Bragg plane formed by directions of propagation of reference and object light beams.

4. The method according to claim 3, wherein the phase modulation encoding of data comprises using a phase-only spatial light modulator comprising a two-dimensional array of independently addressable pixels capable of imparting a phase delay.

5. The method according to claim 3, wherein the phase modulation encoding further comprises orthogonal phase encoding of data patterns using one of deterministic and of pseudorandom orthogonal phase codes.

6. The method according to claim 5, wherein the deterministic orthogonal phase codes comprise Walsh-Hadamard codes, generated from Hadamard matrices for the phase modulation encoding, and wherein Walsh-Hadamard codes of length N comprise N−1 orthogonal DC-balanced phase codes for encoding N−1 different data values using only N pixels.

7. A method for content-addressable storage of a holographic metadatabase for content-addressable search of data, comprising:

creating a metadata representation of an original database comprising at least one of a plurality of metadata sets, wherein each metadata set comprises a structured description of at least one original stored data set;

using data content information contained in each metadata set of the at least one of the plurality of metadata sets comprising the metadatabase for organizing the at least one of the plurality of metadata sets according to a selectable content relationship; and holographically storing at least one of the at least one of the plurality of metadata sets comprising related content with respect to a selected content relationship, as a cluster of at least one of a plurality of data pages contiguously stored in at least one of a plurality of contiguous data storage locations in the at least one holographic data storage medium.

8. The method according to claim 7, wherein the holographic data storage medium is capable of storing the at least one of the plurality of data pages at a same data storage location in the holographic data storage medium using a multiplexing technique selected from at least one of angular, wavelength, shift, peristrophic, polytropic and phase-coded multiplexing, and further comprising:

recording in a same data storage location in the holographic data storage medium at least one of a plurality of metadata pages comprising related content as at least one of a plurality of contiguously addressed data pages with an address separation less than that required by a condition for content-addressable readout of each of the at least one different multiplexed data pages and independently separable detection by different photodetector elements of a photodetector array of each of the at least one diffracted correlation signals.

9. The method according to claim 8, wherein upon content-addressable readout of each at least one different contiguously addressed multiplexed data page with a search key page, each of the at least one stored data pages containing related content produces a diffracted correlation signal incident upon a same photodetector element of the photodetector array, thereby increasing total intensity of the correlation signal detected by a same photodetector element.

10. The method according to claim 8, wherein the multiplexing technique used for storing at least one of the plurality of data pages at a same data storage location in the holographic data storage medium comprises angular multiplexing, and wherein recording at least one of a plurality of contiguously addressed data pages with an address separation less than that required by the condition for content-addressable readout of each at least one different multiplexed data pages and independently separable detection by different photodetector elements of a photodetector array of each of the at least one diffracted correlation signals comprises:

recording at least one of a plurality of contiguously addressed data pages with an angular address separation less than that required by a condition for content-addressable readout of each at least one different multiplexed data pages and independently separable detection by different photodetector elements of the photodetector array of each of the at least one diffracted correlation signals.

11. The method according to claim 7, wherein the selectable content relationship between data sets comprises content similarity.

* * * * *